US008173992B2

(12) United States Patent
Skotnicki et al.

(10) Patent No.: US 8,173,992 B2
(45) Date of Patent: May 8, 2012

(54) TRANSISTOR OR TRIODE STRUCTURE WITH TUNNELING EFFECT AND INSULATING NANOCHANNEL

(75) Inventors: Thomas Skotnicki, Crolles (FR); Stephane Monfray, Grenoble (FR)

(73) Assignee: STMicroelectronics (Crolles 2) SAS, Crolles (FR)

( * ) Notice: Subject to any disclaimer, the term of this patent is extended or adjusted under 35 U.S.C. 154(b) by 303 days.

(21) Appl. No.: 11/672,342

(22) Filed: Feb. 7, 2007

(65) Prior Publication Data

US 2007/0200198 A1 Aug. 30, 2007

(30) Foreign Application Priority Data

Feb. 7, 2006 (FR) ..................... 06 50437

(51) Int. Cl.
 *H01L 29/06* (2006.01)
(52) U.S. Cl. ............... 257/38; 257/30; 257/37; 257/39; 257/E45.001; 438/197
(58) Field of Classification Search .............. 257/30, 257/37, 38, 39, 517, E39.016, E45.001; 438/197
 See application file for complete search history.

(56) References Cited

U.S. PATENT DOCUMENTS

| 3,631,308 A | * | 12/1971 | Krolikowski | 257/38 |
| 4,721,983 A | | 1/1988 | Frazier | 357/4 |
| 5,179,426 A | * | 1/1993 | Iwamatsu | 505/191 |
| 5,272,358 A | * | 12/1993 | Nishino et al. | 257/36 |
| 5,336,904 A | * | 8/1994 | Kusunoki | 257/23 |
| 5,399,546 A | * | 3/1995 | Nakamura et al. | 505/193 |
| 5,408,108 A | * | 4/1995 | Nakamura et al. | 505/191 |
| 6,929,983 B2 | * | 8/2005 | Busta et al. | 438/142 |

FOREIGN PATENT DOCUMENTS

| EP | 1094526 | 4/2001 |
| WO | 2005/034244 | 4/2005 |

OTHER PUBLICATIONS

Fukushima et al., A Novel Nanoscale Metal Transistor Fabricated by Conventional Photolithography, Japanese Journal of Applied Physics, Physical Society of Japan, vol. 38, No. 12B, Dec. 1999.

Fujimaru et al., Nanoscale Metal Transistor Control of Fowler-Nordheim Tunneling Currents Through 16 nm Insulating Channel, Journal of Applied Physics, American Institute of Physics, New York, US, vol. 85, No. 9, May 1, 2999.

Park et al., Fabrication of a Lateral Field Emission Triode With a High Current Density and High Transconductance Using the Local Oxidation of the Polysilicon Layer, IEEE Transactions on Electron Devices, vol. 46, No. 6, Jun. 1999.

* cited by examiner

*Primary Examiner* — Robert Huber
(74) *Attorney, Agent, or Firm* — Allen, Dyer, Doppelt, Milbrath & Gilchrist, P.A.

(57) ABSTRACT

A microelectronic device is provided with at least one transistor or triode with Fowler-Nordheim tunneling current modulation, and supported on a substrate. The triode or the transistor includes at least one first block forming a cathode and at least one second block forming an anode. The first block and the second block are supported on the substrate, and are separated from each other by a channel insulating zone also supported on the substrate. A gate dielectric zone is supported on at least the channel insulating zone, and a gate is supported on the gate dielectric zone.

32 Claims, 6 Drawing Sheets

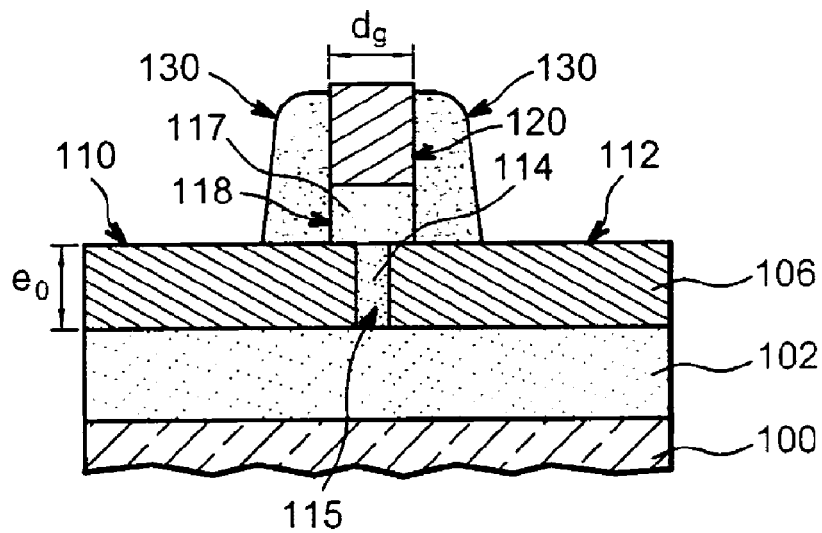
FIG. 2A
(PRIOR ART)
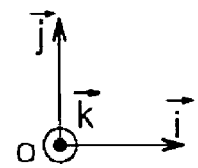
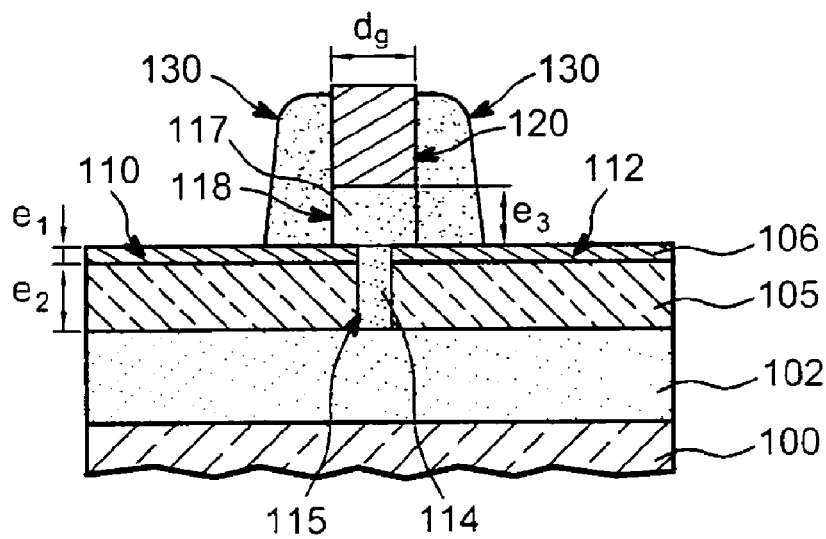
FIG. 2B
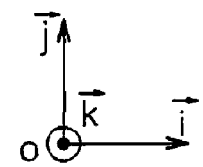

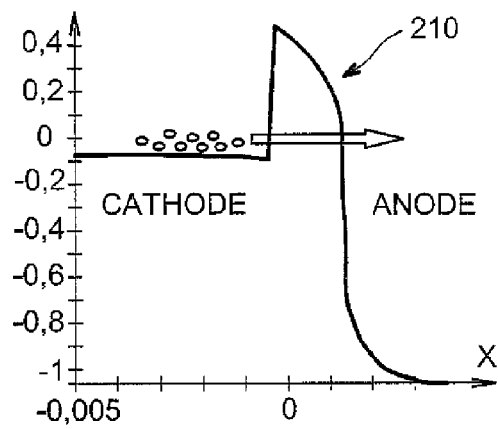
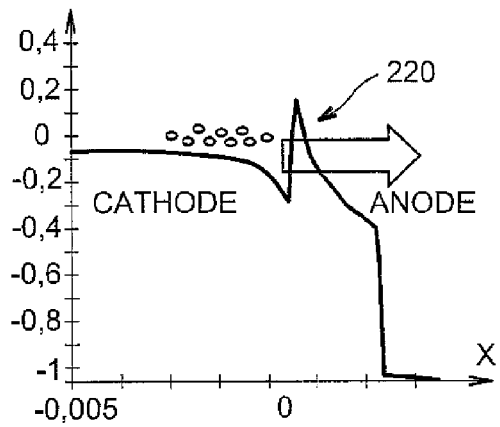
FIG. 3A   FIG. 3B
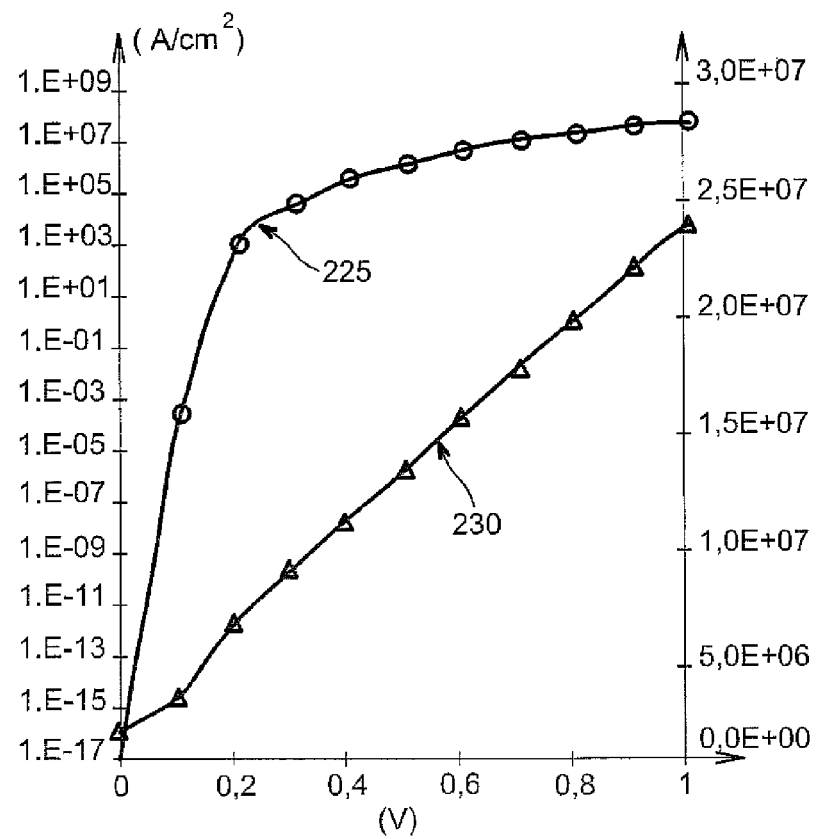
FIG. 4

TRANSISTOR OR TRIODE STRUCTURE WITH TUNNELING EFFECT AND INSULATING NANOCHANNEL

FIELD OF THE INVENTION

The present invention is applicable to microelectronics, and in particular, to microelectronic devices with Fowler-Nordheim tunneling current modulation. The present invention is particularly related to a microelectronic device provided with at least one improved transistor or at least one improved triode, and to a method for making such a device.

BACKGROUND OF THE INVENTION

A microelectronic device with Fowler-Nordheim tunneling current modulation is disclosed in the article titled "Fabrication of Lateral Field Emission Triode with a High Current Density and High Transconductance Using the Local Oxidation of the polysilicon Layer", Park et al., IEEE Transactions on Electron Devices, vol. 46, No. 6, June 1999.

Such a device is illustrated in FIG. 1 and comprises a cathode 11 and an anode 12 facing each other. They are separated by an empty channel space and supported on a substrate 10, for example, of the semiconductor on insulator type. The channel may be on the order of about a hundred nanometers long. The cathode 11 has a pointed shape to encourage electron emission. The device also comprises a gate 15 to control the electron flow between the cathode 11 and the anode 12. The gate 15 is located between the cathode 11 and the anode 12 and is formed in the same plane as the cathode and the anode. The gate 15 is also formed from two separate parts 15a/15b each with a pointed shape and located facing each other.

Modulation of the Fowler-Nordheim current within such a device requires the application of high voltages. Furthermore, particularly due to the shape of the electrodes, it is also difficult to create a channel smaller than 100 nanometers for such a device.

SUMMARY OF THE INVENTION

In view of the foregoing background, an object of the present invention is to provide a Fowler-Nordheim tunneling current modulation structure that is more compact and with better consumption, and a corresponding method for making such a structure.

This and other objects, advantages and features in accordance with the present invention are to provide an improved Fowler-Nordheim type microelectronic tunneling current modulation device, and particularly an improved transistor or triode structure, comprising in a first plane at least one cathode, at least one anode and at least one insulating channel separating the cathode and the anode. The channel, for example, has a critical length or dimension on the order of one nanometer, or about ten nanometers. In a second plane different from the first plane there is at least one Fowler-Nordheim current control gate between the cathode and the anode.

Another aspect of the invention is directed to a microelectronic device provided with at least one transistor or triode with Fowler-Nordheim tunneling current modulation, and supported on a substrate. The transistor or the triode may comprise at least one first block that will act as an anode, and at least one second block that will act as a cathode. The first block and the second block may be supported on the substrate, and are separated from each other by a channel insulating zone also supported on the substrate. At least one gate dielectric zone may be supported on the channel insulating zone, and at least one gate may be supported on the gate dielectric zone.

The critical dimension of the channel insulating zone may be between 1 and 20 nanometers, or between 1 and 10 nanometers, or less than 5 nanometers, for example. For the purposes of this description, critical dimension means the minimum dimension of a geometric pattern made in a thin layer or from a thin layer, apart from the dimension(s) defined by the thickness of this thin layer.

The first anode block and the second cathode block may comprise at least a first layer based on at least a first material (conducting or semiconducting) chosen such that the energy or potential barrier between the first material and the insulating zone is weak.

The first material may be metallic. The first block and the second block may respectively comprise at least one first metallic zone and at least one second metallic zone. The first metallic zone and the second metallic zone may be separated by the channel insulating zone.

The first block and/or the second block may comprise at least one stack of two layers of different materials. The first anode block and the second cathode block may comprise at least one first layer based on the first material, and at least another layer on which the first layer is supported and based on at least a second conducting or semiconducting material. The second material may be chosen such that the energy or potential barrier between the second material and the insulating zone is high or higher than the energy or potential barrier between the first material and the insulating zone.

The second material may be semiconducting. The first block and the second block may comprise at least one third semiconducting zone on which the first metallic zone is supported, and at least one fourth semiconducting zone on which the second metallic zone is supported. The third semiconducting zone and the fourth semiconducting zone may be separated by a channel insulating zone.

The insulating channel may be such that the minimum distance dc1 separating the first and second metallic zones is less than the minimum distance dc2 separating the third and fourth semiconducting zones.

The third zone and the fourth zone may have a thickness $e_2$, while the first zone and the second zone have a thickness $e_1$, such that $e_1 < e_2$. The gate dielectric zone may have a given thickness $e_3$ greater than or equal to the critical dimension of the channel insulating zone.

The channel insulating zone and the gate dielectric zone may be based on different dielectric materials. The channel insulating zone may be based on a dielectric material with a high dielectric constant high-k, or a dielectric constant $k_1$, such that $k_1 > 4.3$. The gate dielectric zone may also be based on a dielectric material with a high dielectric constant high-k, or a dielectric constant $k_3$, such that $k_3 > 4.3$. The gate dielectric zone may be based on a dielectric material with a dielectric constant $k_3$, greater than the dielectric constant $k_1$ of the channel insulating zone.

Another aspect of the invention is directed to a method for making such a device. In particular, the method for making a microelectronic device provided with at least one tunneling effect transistor or triode comprises the following steps:

a) providing a substrate covered with one or more thin layers;

b) making at least one trench in a thin layer separating at least one first block that will act as cathode of the transistor or the triode, and at least one second block that will act as anode of the transistor or the triode;

c) filling in the trench based on at least one dielectric material so as to form a channel insulating zone between the first block and the second block; and d) forming at least one gate dielectric zone supported on the channel insulating zone and at least one gate on the gate dielectric zone.

The channel insulating zone may have a critical dimension between 1 and 20 nanometers, or between 1 and 10 nanometers, or less than 5 nanometers, for example. The gate dielectric zone may have a given thickness $e_3$ greater than the critical dimension of the channel insulating zone.

According to a first variation, formation of the gate dielectric zone may include deposition of one gate dielectric layer on the first block, the channel insulating zone and the second block. The gate dielectric layer and the channel insulating zone may be based on different dielectric materials.

According to a second variation in which the filling in step c) is done so as to project beyond the opening in the trench and to form a layer based on the dielectric material supported on the first block, the second block and the filled in trench, formation of the gate dielectric zone in step d) may include etching of the layer based on the dielectric material.

The channel insulating zone may be formed in step c) based on a dielectric material with a high dielectric constant high-k or with a dielectric constant $k_1 > 4.3$.

The thin layers may include at least one first layer based on at least one first conducting or semiconducting material chosen such that the energy or potential barrier between the first material and the insulating zone is weak. The first layer may be metallic.

The thin layers may include a stack of at least one first layer and at least one second layer supported on the first layer and based on at least one material different from the material from which the first layer is made. The second layer may be semiconducting.

Formation of the trench in step c) may include anisotropic etching so as to form a first hole in the first layer, and a second hole in the second layer and in the prolongation of the first hole; and isotropic etching of the second layer, selective with regard to the first layer so as to widen the second hole. The first layer and the second layer may have a first thickness $e_1$ and a second thickness $e_2$ respectively, wherein the first thickness $e_1$ may be less than the second thickness $e_2$.

BRIEF DESCRIPTION OF THE DRAWINGS

The present invention will be better understood after reading the description of example embodiments given purely for information and that are in no way limiting, with reference to the appended figures, wherein:

FIG. 2A illustrates an example of a Fowler-Nordheim type of microelectronic triode or transistor tunneling effect device according to the prior art, and FIG. 2B illustrates an improved to the microelectronic device in accordance with the invention;

FIGS. 3A-3B, 4 and 5 illustrate electrical characteristics of a microelectronic device according to the invention;

Identical, similar or equivalent parts of the different figures are marked with the same numbers so as to facilitate cross referencing from one figure to the other. The different parts shown in the figures are not necessarily shown at the same scale to make the figures more easily readable.

DETAILED DESCRIPTION OF THE PREFERRED EMBODIMENTS

Figure 1:
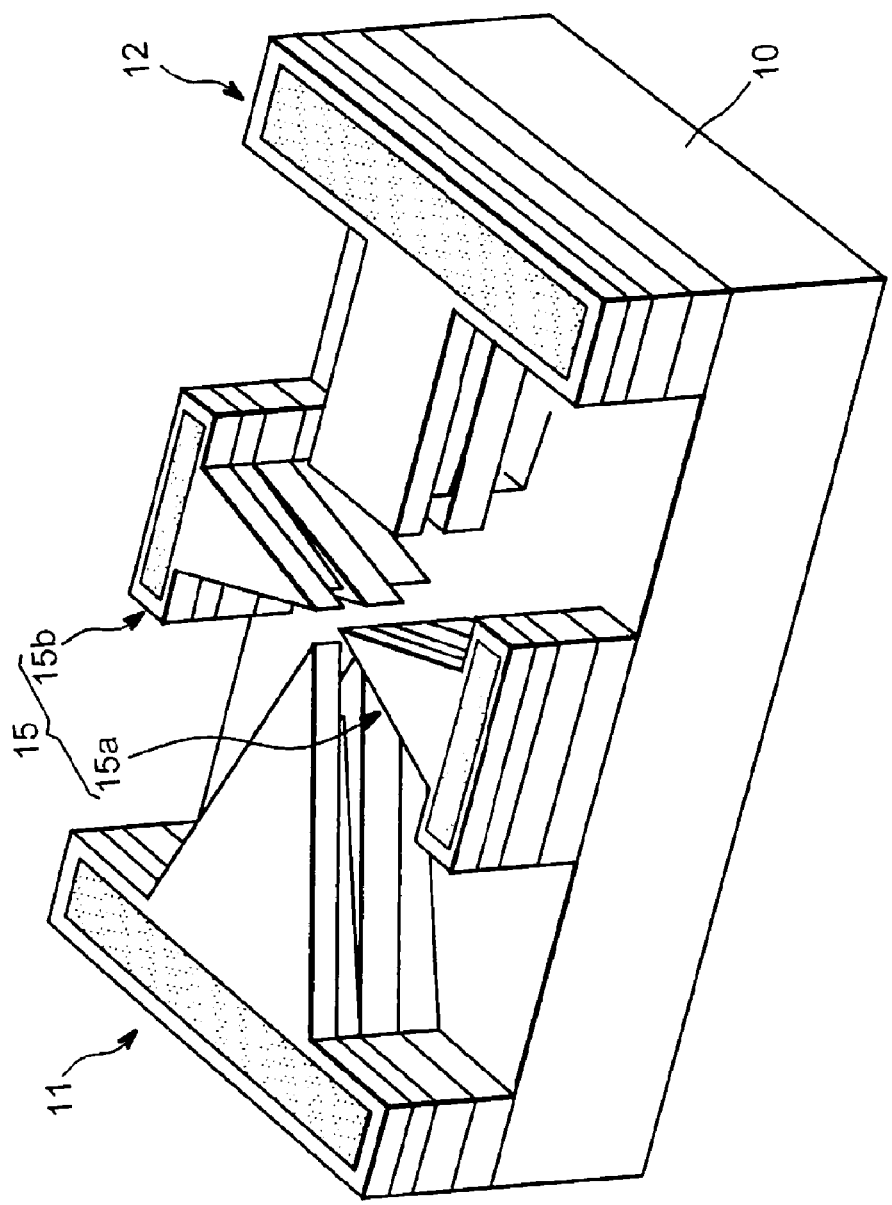
FIG. 1 represents an example microelectronic device according to prior art.

An example of a microelectronic device provided with at least one triode or at least one transistor with Fowler-Nordheim tunnel current modulation will now be discussed with reference to FIG. 2A.

The triode or transistor is formed on a substrate that may comprise a support 100 based on a semiconducting material, for example silicon, covered with an insulating layer 102, for example based on $SiO_2$. Separate blocks 110 and 112 are supported on the insulating layer 102 and are designed to form an anode and a cathode for the transistor or triode respectively. The thickness $e_0$ of the blocks 110 and 112 (measured in a direction parallel to a vector $\vec{j}$ of an orthogonal coordinate system $[O; \vec{i}; \vec{j}; \vec{k}]$ indicated in FIGS. 2A and 2B), may be, for example, between 1 and 10 nanometers thick.

The blocks 110 and 112 are separated by a channel insulating zone 115 supported on the substrate. The minimum distance between the blocks 110 and 112 or the critical dimension dc (measured along a direction parallel to the $\vec{i}$ vector in the $[O; \vec{i}; \vec{j}; \vec{k}]$) coordinate system in the channel insulating zone 115 may be, for example, between 1 and 20 nanometers or between 1 and 10 nanometers, or less than 5 nanometers, for example on the order of 2 nanometers. The channel insulating zone 115 may be based on at least one dielectric material 114, for example, such as $SiO_2$, a material with a high dielectric constant high-k or with a dielectric constant $k_1$ at least equal to 4.3. The channel insulating zone 115 may be, for example, based on a high-k material chosen from among the $HfO_2$, $ZrO_2$, $Y_2O_3$ and $LaO_2$ materials.

The anode and cathode blocks 110, 112 comprise at least one layer based on at least one first conducting or semiconducting material 106, chosen such that the energy or potential barrier between the channel insulating zone 115 and the layer based on the first material 106 is weak. The material may be a metal, for example caesium. This is particularly so in a case in which the channel insulating zone 115 is based on $SiO_2$.

Another insulating zone 118 based on a gate dielectric material 117, for example $SiO_2$, is supported on the channel insulating zone 115 and possibly on the blocks 110 and 112. The channel insulating zone 115 and the gate dielectric zone 118 may be formed from different dielectric materials 114, 117. The gate dielectric zone 118 may be based on a high-k dielectric material or a material with a dielectric constant $k_3$ equal to at least 4.3. The gate dielectric zone 118 may be based on a dielectric material with a dielectric constant $k_3$ greater than the dielectric $k_1$ of the channel insulating zone. For example, the thickness $e_3$ of the zone 118 based on the gate dielectric (measured in a direction parallel to vector $\vec{j}$ in the $[O; \vec{i}; \vec{j}; \vec{k}]$ coordinate system) is between 1 nanometer and 5 nanometers and preferably greater than the critical dimension dc of the channel insulating zone 115.

There is a gate 120 on top of the gate dielectric zone 118, formed from a block based on a gate material, for example, based on a semiconductor such as polySi or polySiGe, and/or a metal such as molybdenum, TiN, or TaN. The critical dimension dg of the gate 120 may be between 2 and 20 nanometers. The gate 120 is located facing the channel insulating zone 115 and in a plane different from the plane of the anode and cathode blocks 110 and 120. The device may also comprise insulating zones 130 commonly called spacers formed on each size of the gate 120.

FIG. 2B illustrates an improved variation of the previously described device for which the blocks 110 and 112 are formed from a stack comprising a layer based on at least one first material 106 supported on another layer based on at least one second material 105 different from the first material 106. For example, different materials 105, 106 mean that the energy or potential barrier between the channel insulating zone and the first material layer is different from the energy or potential barrier between the channel insulating zone and the layer of second material.

The second material 105 may be chosen such that the energy or potential barrier between the channel insulating zone 115 and the layer of second material 105 is high, while the first material 106 is chosen such that the energy or potential barrier between the channel insulating zone 115 and the first material 106 is weak and/or weaker than the energy or potential barrier between the channel insulating zone 115 and the second material 105.

The first material 106 may be metallic. The first material 106 may be, for example caesium, particularly in a case in which the insulating zone 115 is based on $SiO_2$, or it may be based on one of the Ta, Ti, TiW, Al, Zr, $ZrSi_2$, $TiSi_2$ materials. This is particularly so if the second material 105 is an N doped semiconducting material, and when the channel insulating zone 115 is based on a high-k material.

The first material 106 may be based on one of the Pd, Ir, Ru, Os, Pt materials. This is particularly so in the case in which the second material 105 is a P doped semiconductor, and when the channel insulating zone 115 is based on a high-k material. The second material 105 may be semiconducting, for example Si or SiGe or Ge, possibly N or P doped. In the anode and cathode blocks 110 and 112, the thickness $e_1$ of the first material layer 106 may be, for example, between 0.5 and 5 nanometers, while the thickness $e_2$ of the second material layer 105 may be greater than the thickness $e_1$ of the layer of first material 106, for example between 2 and 10 nanometers.

Operation of such a device is based on a Fowler-Nordheim type tunneling current modulation between the cathode and the anode (FIGS. 3A, 3B, 4 and 5). The current is modulated as a function of potentials Vg, Vc, Va that will be applied to the gate 120, the cathode block 112 and the anode block 110 respectively. The prohibited band width in the channel insulating zone 115 may be modulated as a function of the potential Vg applied to the gate 120, as illustrated in FIGS. 3A and 3B.

A first conduction band energy profile 210 for a first given bias state of the transistor or the triode is shown in FIG. 3A, for example such as Vg=0 volt and Va=1 volt. For this first bias state, the electrical field E1 at the cathode/channel insulating zone interface may be, for example, on the order $2*10^6$ V/cm.

FIG. 3B shows a second conduction band energy profile 220 for another given bias state of the transistor or triode, for example such that Vg=1 volt and Va=1 volt. For this second bias state, the electrical field E2 at the cathode/channel insulating zone interface may be, for example, on the order of $2*10^7$ V/cm.

FIG. 4 contains a curve 225 representative of a Fowler-Nordheim current/gate voltage Vg characteristic, and a curve 230 representative of the electrical field at the interface between the cathode block 112 and the channel insulating zone 115 as a function of the gate voltage Vg as an example of a microelectronic device previously described with reference to FIG. 2B. The curve 225 shows that the variation of the Fowler-Nordheim current within a microelectronic device may be very large for a small variation of the bias potential applied to the gate 120.

Figure 5:
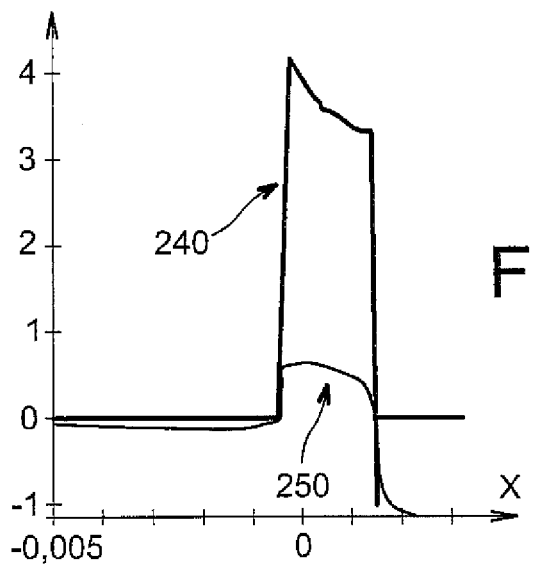

The device described above with reference to FIG. 2B may have better electrical performances than a device in which the anode and cathode blocks 110 and 112 are formed solely from the first material 106. A stack of layers of different materials can be used to create several different potential barriers depending on the current height (defined in a direction parallel to the $\vec{j}$ vector in the $[O;\vec{i};\vec{j};\vec{k}]$ coordinate system) of the channel insulating zone 115. A two layer stack of different materials 105, 106 can be used to create a double barrier as shown in FIG. 5.

For a microelectronic device used according to the invention and as described above with reference to FIG. 2B, FIG. 5 shows a conduction band energy profile 240 for a channel region 150 located along an axis parallel to the vector $\vec{i}$ between regions of the first anode block 110 and the second cathode block 112 based on the second material 105. Also shown is another conduction band energy profile 250 in another channel region 150 located along an axis parallel to the $\vec{i}$ vector between regions in the first anode block 110 and the second cathode block 112 based on the first material 106. The use of a stack of layers of different materials 105, 106 can eliminate or very significantly reduce leakage currents due to a phenomena causing lowering of the conduction barrier, similar to the phenomena commonly called Drain Induced Barrier Lowering (DIBL) in MOS transistors.

The microelectronic device is not limited to a simple gate structure like that described above, and it may, for example, comprise a double gate structure provided with at least two patterns based on gate materials located on each side of the channel insulating zone 115 and in planes different from the planes of the cathode and anode.

An example embodiment of a microelectronic device of the type that has just been described above will now be given with reference to FIGS. 6A-6E. The initial material for this method may be a substrate formed from a support 100 that may be semiconducting, for example, based on silicon covered with an insulating layer 102, for example based on $SiO_2$. A layer with thickness $e_2$, for example, between 2 and 10 nanometers and based on a material 105 that will be called a second material, is formed on the insulating layer 102, for example, by deposition and by bonding.

The second material 105 may be a semiconductor such as Si, or for example Ge or SiGe. Another layer with thickness $e_1$, for example between 0.5 and 5 nanometers and based on a material 106 that will be called the first material, for example, a metallic material, is then made on the second material 105.

Figure 6A:
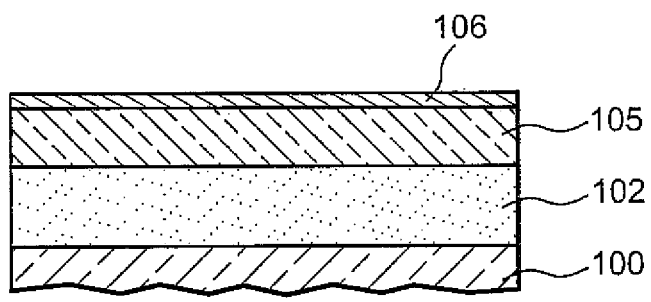
FIGS. 6A-6E illustrate a method for making a microelectronic device according to the invention.
Figure 6B:
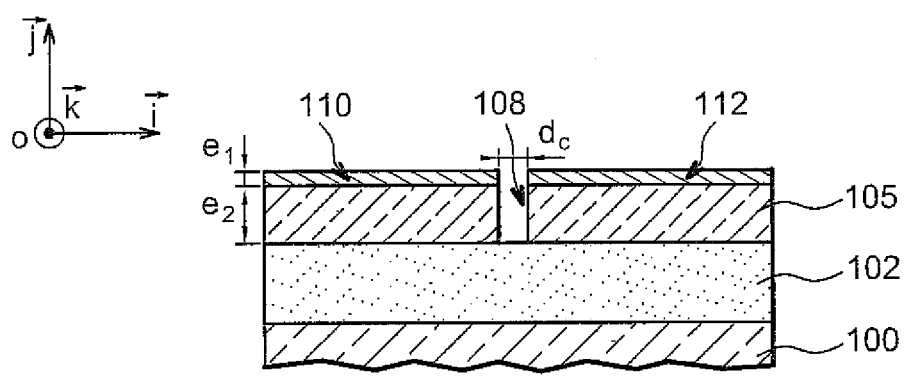
Figure 6C:
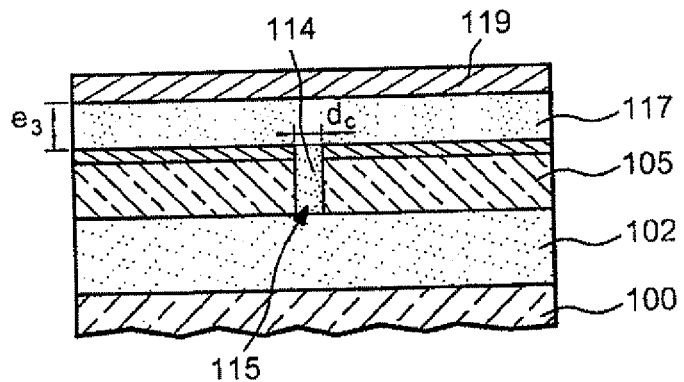

The first material 106 may be one of the Cs, Ta, Ti, TiW, Al, Zr, $ZrSi_2$, $TiSi_2$ materials, particularly in a case in which the second material 105 is a semiconductor that will be N doped. The first material 106 may be one of the Pd, Ir, Ru, Os, Pt materials, particularly in another case in which the second material 105 is a semiconductor that will be P doped (FIG. 6A).

At least one trench 108 is then formed in the layer based on the first material 106 and in the layer based on the second material 105. The trench 108 exposes the insulating layer 102 of the substrate. The critical dimension dc of the trench 108 may be, for example, between 1 and 20 nanometers, or between 1 and 10 nanometers, or less than 5 nanometers, for example, on the order of 2 nanometers. The trench 108 may be made by photolithography and then etching steps, for example, anisotropic etching using chlorine or bromine.

Separate blocks 110 and 112 are thus made separate by the trench 108. These blocks 110 and 112 are intended to form an anode of a triode and a cathode of a transistor (FIG. GB).

The trench 108 is then filled using a first dielectric material 114, for example, based on a dielectric such as $SiO_2$ or a high-k dielectric such as $HfO_2$, $ZrO_2$ or $Y_2O_3$, or $LaO_2$. A channel insulating zone 115 is then formed between the blocks 110 and 112.

The trench 108 may be filled such that the first dielectric material 114 projects from the opening of the trench 108 and forms a layer covering the blocks 110 and 112. The layer based on the first dielectric material 114 covering the blocks 110 and 112 and the filled trench 108 may form a gate dielectric layer that will be etched to form a gate dielectric zone.

According to one variation (FIG. 6C), the trench 108 may be filled by the first dielectric material 114 up to the level of the opening of the trench 108. A gate dielectric layer 117 with thickness $e_3$, for example, between 1 and 20 nanometers, or between 1 and 10 nanometers, or between 1 and 5 nanometers, and based on a second dielectric material 117 different from the first dielectric material 114, may be formed on the filled trench 108 and on the blocks 110 and 112. The thickness $e_3$ of the gate dielectric layer 116 is preferably chosen to be greater than the critical dimension dc of the insulating zone 115 based on the first dielectric material 114.

A layer based on a gate material 119 is then formed on the gate dielectric layer 117. The gate material 119 may be, for example, based on a semiconducting material such as PolySi or PolySiGe, and/or a metal such as W or Mo.

Figure 6D:
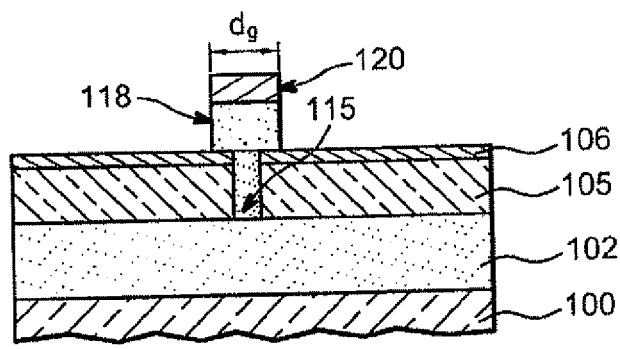

A pattern of at least one gate 120 is then formed in the layers 117 and 119 of the gate dielectric and the gate material, supported on a gate dielectric zone 118, for example, by photolithography and etching steps. The gate pattern 120 is located in a plane different from the plane of the blocks 110, 112 and the insulating zone 115 separating these blocks. The critical dimension dg of the gate pattern 120 may be between 2 and 20 nanometers (FIG. 6D). An N type or P type doping can then be made in the regions of blocks 110 and 112 based on the first material 104.

Figure 6E:
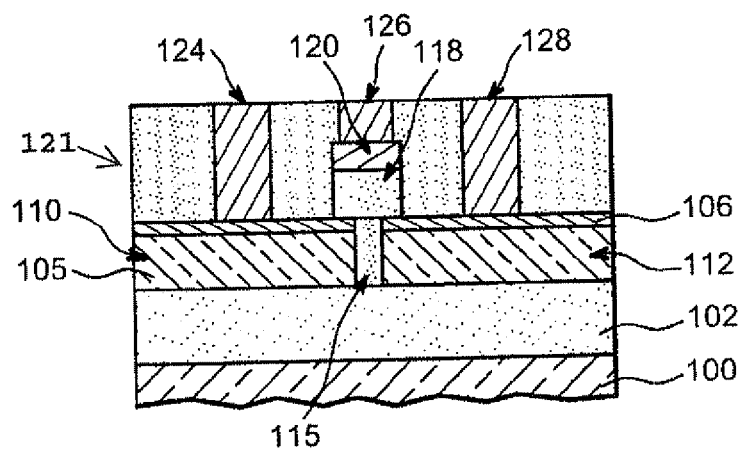

Contacts 124, 126, 128 may then be formed separately on the anode block 110, on the gate 120 and on the cathode block 112. The contacts 124, 126, 128, may be, for example, made by deposition of an insulating layer 121, for example, based on $SiO_2$, covering the gate 120 and the blocks 110, 112. This is followed by formation of openings in the insulating layer 121, at least one opening of which exposes the first block 110, at least one opening exposing the second block 112, and at least one opening exposing the gate 120. The openings are then filled, for example, with at least one metallic material (FIG. 6E). According to one embodiment, insulating spacers may be formed on each side of the gate after the gate 120 has been formed and before the contacts 124, 126, 128 are formed.

Figure 7A:
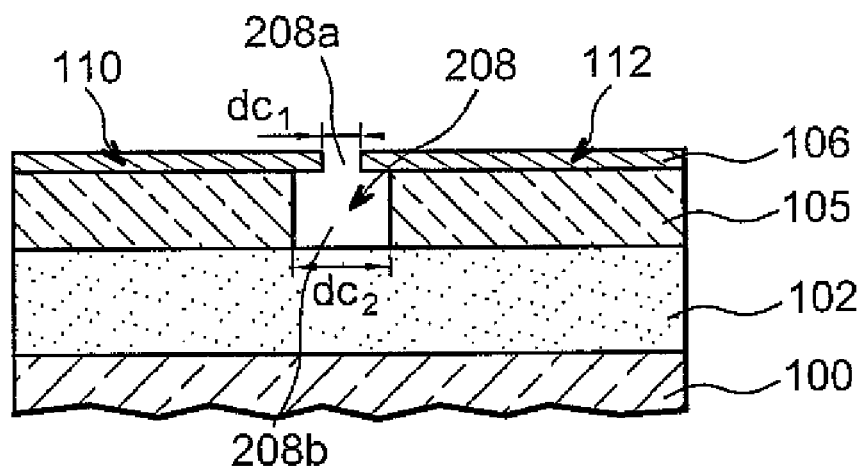
FIGS. 7A-7B illustrate a variation of the method for making a microelectronic device according to the invention.
Figure 7B:
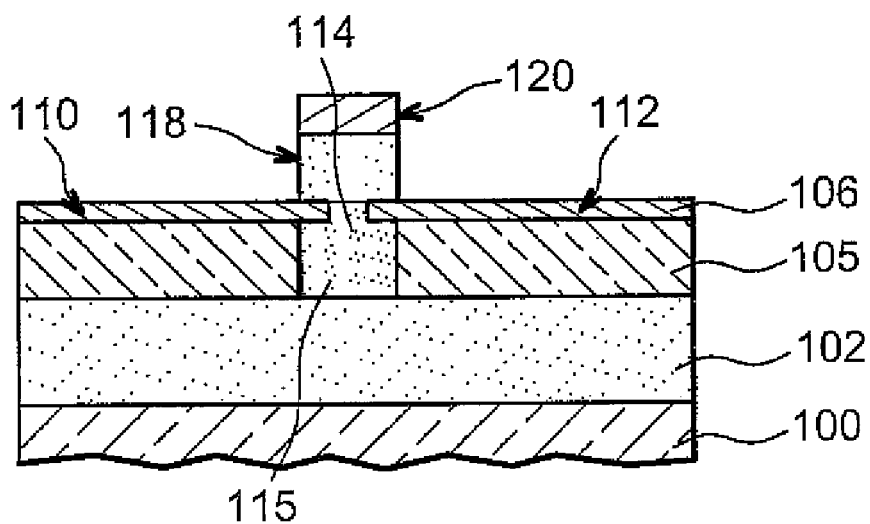

A variation of the channel insulating zone 115 separating the blocks 110 and 112 is illustrated in FIGS. 7A and 7B. For this variation, at least one first hole 208a is formed in the layer based on the first material 106, and at least one second hole 208b is formed in the layer based on the second material 105 and in the prolongation of the first hole 208a. The holes 208a, 208b may be made by photolithography, then anisotropic etched, for example, using chlorine or bromine.

The next step is to widen the second hole 208b, for example, by isotropic etching of the first material 106, for example, using fluorine (FIG. 7B). After isotropic etching, the critical dimensions of the first hole 208a and the second hole 208b are equal to $dc_1$ and $dc_2$, respectively, such that $dc_2 > dc_1$, and form a trench 208 with a narrowed opening separating the blocks 110 and 112.

The steps like those described above with reference to FIGS. 6A-6D can then be performed to form a channel insulating zone 115 by filling the trench 208, then forming a gate dielectric zone 118 and a gate 120. FIG. 7B illustrates the transistor device once the gate 120 has been formed. In this figure, the first anode block 110 and the second cathode block 112 each comprises a zone based on a metallic material 106 supported on a zone based on a semiconducting material 105. Each block also comprises another zone based on a metallic material 106 supported on another zone based on the semiconducting material 105, respectively. The metallic cathode and anode zones are located at a first minimum distance $dc_1$ from each other, while the cathode and anode semiconducting zones are located at a second minimum distance $dc_2$ from each other, greater than the first distance $dc_1$.

That which is claimed:

1. A microelectronic device comprising:
   a substrate; and
   at least one tunneling effect transistor or triode on said substrate, and comprising
      at least one first block on said substrate and defining an anode,
      at least one second block on said substrate and defining a cathode,
      at least one of said first and second blocks comprising at least one, stack of different layers of materials, with the at least one stack of different layers of materials comprising a plurality of conducting layers directly contacting one another so that an interface therebetween is devoid of an insulating layer,
      at least one channel insulating zone comprising a dielectric material on said substrate and contacting opposing sides of said at least one first and second blocks,
      at least one gate dielectric on said at least one channel insulating zone, and on an upper surface of said at least one first and second blocks, said at least one gate dielectric completely overlying said at least one channel insulating zone and partially overlying each conducting layer in each of said first and second blocks,
      at least one gate on said at least one gate dielectric,
      an insulating layer on said first and second blocks and on said at least one gate,
      a first conductive via in said insulating layer to define a first contact contacting said at least one first block, and
      a second conductive via in said insulating layer to define a second contact contacting said at least one second block.

2. A microelectronic device according to claim 1, wherein said at least one channel insulating zone has a critical dimension between 1 and 10 nanometers.

3. A microelectronic device according to claim 1, wherein each of said first and second blocks comprises a stack of the different layers of materials, and said stack for said first block comprises a first conducting layer and said stack for said second block comprises a second conducting layer, said first and second conducting layers being separated from each other by a first distance defined by said at least one channel insulating zone.

4. A microelectronic device according to claim 3, wherein said stack for said first block comprises a third semiconducting layer supporting said first conducting layer and said stack for said second block comprises a fourth semiconducting layer supporting said second conducting layer, said third and fourth semiconducting layers being separated from each other by a second distance defined by said at least one channel insulating zone.

5. A microelectronic device according to claim 4, wherein the first distance is less than the second distance.

6. A microelectronic device according to claim 4, wherein said first and second conducting layers each has a first thickness, and said third and fourth layers each has a second thickness greater than the first thickness.

7. A microelectronic device according to claim 1, wherein said at least one gate dielectric has a given thickness, and said at least one channel insulating zone has a critical dimension less than the given thickness of said at least one gate dielectric.

8. A microelectronic device according to claim 1, wherein said at least one channel insulating zone and said at least one gate dielectric comprise different dielectric materials.

9. A microelectronic device according to claim 8, wherein the dielectric material of said at least one channel insulating zone has a dielectric constant greater than 4.3.

10. A microelectronic device comprising:
a substrate;
an insulating layer on said substrate; and
at least one tunneling effect structure on said insulating layer, and comprising
a first block on said insulating layer and defining an anode,
a second block on said insulating layer and defining a cathode,
said first block comprising a first conducting layer, and said second block comprising a second conducting layer,
said first block comprising a third semiconducting layer supporting said first conducting layer, and said second block comprising a fourth semiconducting layer supporting said second conducting layer, and an interface between said third conducting layer and said first conducting layer is devoid of an insulating layer and an interface between said fourth conducting layer and said second conducting layer is devoid of an insulating layer,
a channel insulating zone comprising a dielectric material on said insulating layer and contacting opposing sides of said first and second-blocks,
a gate dielectric completely overlying said channel insulating zone and partially overlying said first and third conducting layers in said first block and said second and fourth conducting layers in said second block,
a gate on said gate dielectric zone,
an insulating layer on said first and second blocks and on said gate,
a first conductive via in said insulating layer to define a first contact contacting said at least one first block, and
a second conductive via in said insulating layer to define a second contact contacting said at least one second block.

11. A microelectronic device according to claim 10 wherein the at least one tunneling effect structure comprises a transistor.

12. A microelectronic device according to claim 10 wherein the at least one tunneling effect structure comprises a triode.

13. A microelectronic device according to claim 10, wherein said channel insulating zone has a critical dimension between 1 and 10 nanometers.

14. A microelectronic device according to claim 10, wherein said first and second conducting layers are separated from each other by a first distance defined by said channel insulating zone.

15. A microelectronic device according to claim 14, wherein said third and fourth semiconducting layers are separated from each other by a second distance defined by said channel insulating zone.

16. A microelectronic device according to claim 15, wherein the first distance is less than the second distance.

17. A microelectronic device according to claim 10, wherein said first and second conducting layers each has a first thickness, and said third and fourth layers each has a second thickness greater than the first thickness.

18. A microelectronic device according to claim 10, wherein said gate dielectric has a given thickness, and said channel insulating zone has a critical dimension less than the given thickness of said gate, dielectric.

19. A microelectronic device according to claim 10, wherein said channel insulating zone and said gate dielectric comprise different dielectric materials.

20. A microelectronic device according to claim 10, wherein the dielectric material of said channel insulating zone has a dielectric constant greater than 4.3.

21. A method for making a microelectronic device comprising at least one tunneling effect transistor or triode, the method comprising:
forming at least one first block on a substrate for defining an anode;
forming at least one second block on the substrate for defining a cathode;
at least one of the first and second blocks comprising at least one stack of different layers of materials, with the at least one stack of different layers of materials comprising a plurality of conducting layers directly contacting one another so that an interface therebetween is devoid of an insulating layer;
forming at least one channel insulating zone comprising a dielectric material on the substrate that contacts opposing sides of the at least one first and second blocks;
forming at least one gate dielectric to completely overlie the channel insulating zone and to partially overlie each conducting layer in each of the first and second blocks;
forming at least one gate on the at least one gate Dielectric;
forming insulating layer on the first and second blocks and on the at least one gate,
forming a first conductive via in the insulating layer to define a first contact contacting said at least one first block, and
forming a second conductive via in the insulating layer to define a second contact contacting said at least one second block.

22. A method according to claim 21, wherein the at least one channel insulating zone has a critical dimension between 1 and 10 nanometers.

23. A method according to claim 21, wherein the at least one gate dielectric has a given thickness, and the at least one channel insulating zone has a critical dimension less than the given thickness of the at least one gate dielectric.

24. A method according to claim 21, wherein forming the at least one gate dielectric comprises forming at least one gate dielectric layer on the at least one first block, on the at least one channel insulating zone and on the at least one second block, with the at least one gate dielectric layer and the at least one channel insulating zone comprising different dielectric materials.

25. A method according to claim 21, wherein forming the at least one channel insulating zone comprises:
- forming at least one trench between the at least one first and second blocks;
- filling the at least one trench with the dielectric material so that the at least one channel insulating zone projects beyond an opening in the trench; and
- the at least one gate dielectric also being formed on the at least one first block and on the at least one second block.

26. A method according to claim 21, wherein each of said first and second blocks comprises a stack of the different layers of materials, and the stack for the first block comprises a first conducting layer and the stack for the second block comprises a second conducting layer, the first and second conducting layers being separated from each other by a first distance defined by the at least one channel insulating zone.

27. A method according to claim 26, wherein the stack for the first block comprises a third semiconducting layer supporting the first conducting layer and the stack for the second block comprises a fourth semiconducting layer supporting the second conducting layer, the third and fourth semiconducting layers being separated from each other by a second distance defined by the at least one channel insulating zone.

28. A method according to claim 27, wherein the first distance is less than the second distance.

29. A method according to claim 27, wherein the first and second conducting layers each has a first thickness, and the third and fourth layers each has a second thickness greater than the first thickness.

30. A method according to claim 21, wherein the at least one channel insulating zone and the at least one gate dielectric comprises different dielectric materials.

31. A method according to claim 21, wherein the at least one channel insulating zone comprises a dielectric material having a dielectric constant greater than 4.3.

32. A method according to claim 21, wherein the different layers in the at least one stack comprises a first layer on a second layer; and wherein forming the at least one channel insulating zone comprises forming a trench in the first and second layers, the forming comprising:
- performing an isotropic etching for forming a first hole in the first layer and a second hole in the second layer, with the second hole being formed in a direction of the first hole; and
- performing an isotropic etching of the second layer, selective with respect to the first layer for widening the second hole.

* * * * *

UNITED STATES PATENT AND TRADEMARK OFFICE
CERTIFICATE OF CORRECTION

PATENT NO. : 8,173,992 B2
APPLICATION NO. : 11/672342
DATED : May 8, 2012
INVENTOR(S) : Thomas Skotnicki et al.

It is certified that error appears in the above-identified patent and that said Letters Patent is hereby corrected as shown below:

Column 10, Line 18    Delete: "gate, dielectric"
                      Insert: -- gate dielectric --

Signed and Sealed this
Ninth Day of April, 2013

Teresa Stanek Rea
*Acting Director of the United States Patent and Trademark Office*